(12) United States Patent
Yun

(10) Patent No.: US 7,608,545 B2
(45) Date of Patent: Oct. 27, 2009

(54) SEMICONDUCTOR DEVICE

(75) Inventor: Young-Je Yun, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 7 days.

(21) Appl. No.: 11/780,970

(22) Filed: Jul. 20, 2007

(65) Prior Publication Data

US 2008/0026587 A1    Jan. 31, 2008

(30) Foreign Application Priority Data

Jul. 24, 2006    (KR) .................. 10-2006-0068994

(51) Int. Cl.
*H01L 21/311*    (2006.01)
(52) U.S. Cl. ............. 438/700; 438/706; 438/712; 257/E21.231; 257/E21.218; 257/E21.227; 257/E21.245
(58) Field of Classification Search ........ 438/9, 438/671, 706, 700, 712, 717
See application file for complete search history.

(56) References Cited

U.S. PATENT DOCUMENTS 6,221,061 B1 *   4/2001   Engelson et al. ............ 438/622
6,448,176 B1 *   9/2002   Grill et al. ................... 438/637
6,767,825 B1 *   7/2004   Wu ............................. 438/633
7,129,159 B2 *   10/2006  America et al. ............. 438/618
7,135,406 B2 *   11/2006  Lin et al. .................... 438/675

* cited by examiner

*Primary Examiner*—David Nhu
(74) *Attorney, Agent, or Firm*—Sherr & Vaughn, PLLC

(57) ABSTRACT

Embodiments relate to a semiconductor device and a method of manufacturing a semiconductor. In embodiments, the method may include a first exposure step of performing an exposure process for forming a first photoresist on a semiconductor substrate at one side of the outside of a trench pattern which will be formed, a first etching step of performing a predetermined dry etching method with respect to the first photoresist, a second exposure step of performing an exposure process for forming a second photoresist at the other side of the outside of the trench pattern, which is a side opposite to the first photoresist, and a second etching step of performing the predetermined dry etching method with respect to the second photoresist.

16 Claims, 3 Drawing Sheets

SEMICONDUCTOR DEVICE

The present application claims priority under 35 U.S.C. 119 and 35 U.S.C. 365 to Korean Patent Application No. 10-2006-0068994 (filed on Jul. 24, 2006), which is hereby incorporated by reference in its entirety.

BACKGROUND

In a 90-nm-node semiconductor device, to form an active layer or a Cu wiring, a trench pattern having a narrow pitch of 100 nm or less may need to be formed. However, even if a high-cost exposure apparatus using a short-wavelength light source having a wavelength of 193 nm or less is used, a minimum pitch $p_{min}$ of a pattern which can be formed in an exposure process may be restricted to $p_{min}=\lambda/NA$ (here, $\lambda$ denotes a wavelength and NA denotes a numerical aperture). For example, when an exposure process is performed using an exposure apparatus having a wavelength of 248 nm and a NA of 0.68, a realizable minimum pitch $p_{min}$ may be restricted to 365 nm.

To address such a problem, a double exposure method of performing an exposure process using double masks to form a photoresist (PR) pattern may be used. The double exposure method may be used to reduce a pattern pitch of a semiconductor device. The double exposure method may be performed using two masks to form a final pattern and may improve a resolution of a photoresist pattern finally manufactured. Because the PR pattern functions as an etching hard mask if a deep narrow pattern is formed in a reactive ion etching (RIE) process, the pitch of a pattern which can be realized when a narrow trench pattern having a pitch of 100 nm or less may be formed in the etching process, may be restricted.

SUMMARY

Embodiments relate to a semiconductor device, and to a method of manufacturing a semiconductor device, which may be capable of forming a trench pattern of the semiconductor device with a minimum pitch of high resolution.

Embodiments relate to a method of manufacturing a semiconductor device, which may be capable of forming a trench pattern with a minimum pitch of high resolution using a general exposure apparatus and etching technology.

According to embodiments, a method of manufacturing a semiconductor device may include a first exposure step of performing an exposure process for forming a first photoresist on a semiconductor substrate at one side of the outside of a trench pattern which will be formed, a first etching step of performing a predetermined dry etching method with respect to the first photoresist, a second exposure step of performing an exposure process for forming a second photoresist at the other side of the outside of the trench pattern, which is a side opposite to the first photoresist, and a second etching step of performing the predetermined dry etching method with respect to the second photoresist.

According to embodiments, a method of manufacturing a semiconductor device may include a first exposure step of performing an exposure process for forming at least one first photoresist on a semiconductor substrate at a predetermined interval; a first dry etching step of performing a predetermined dry etching method with respect to the semiconductor substrate, on which the at least one first photoresist may be formed, and forming a first trench pattern; a second exposure step of performing an exposure process forming a second photoresist at a position spaced apart from the inner side surface of the first trench pattern by a predetermined distance; and a second dry etching step of performing the predetermined dry etching method with respect to the second photoresist and forming a final trench pattern.

DRAWINGS

DETAILED DESCRIPTION

FIGS. 1A to 1D are cross-sectional drawings illustrating a semiconductor device according to embodiments. To obtain a required pitch of trench pattern 130, an exposure process and an etching process may be performed twice so as to form a trench narrower than a pattern formed by a single exposure/etching process.

Figure 1A:
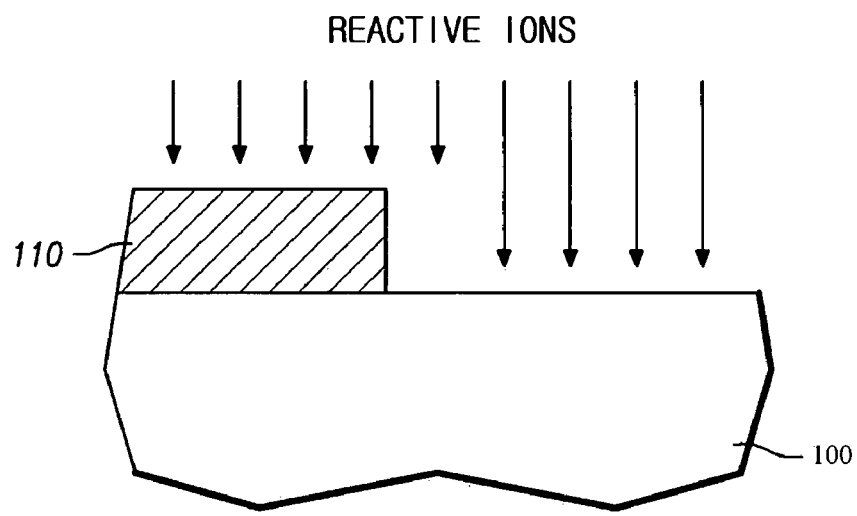
FIGS. 1A to 1D are cross-sectional drawings illustrating a semiconductor device according to embodiments.

Referring to FIG. 1A, a first exposure process for forming first photoresist 110 on substrate 100 at one side of a region in which trench pattern 130 may be formed may be performed.

In the first exposure process, a photoresist film coated on substrate 100 may be subjected to an exposure process in a general exposure apparatus using a predetermined exposure mask (not shown) and may be baked in a baking apparatus. In embodiments, the exposed photoresist film may be removed using a predetermined development solution such that only first photoresist 110 remains, as illustrated in FIG. 1A.

Figure 1B:
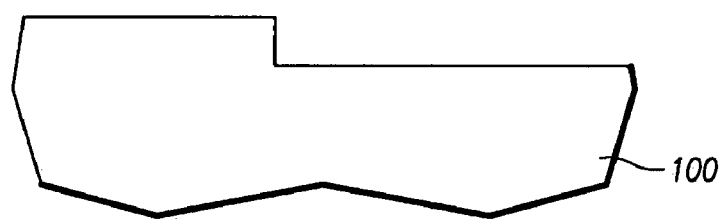

Referring to FIG. 1B, a first etching process may be performed using a predetermined dry etching method with respect to substrate 100, on which first photoresist 110 may have been formed. This may form a pattern of substrate 100.

According to embodiments, in the first etching process for forming the pattern of substrate 100 shown in FIG. 1B, a reactive ion etching (RIE) method may be used as the predetermined dry etching method. If substrate 100 is a substrate formed of an oxide film ($SiO_2$), a RIE method using fluoride gas, such as $CF_4$ as an etching gas may be performed as the dry etching method. Alternatively, in embodiments, if substrate 100 is a low-k substrate such as black diamond, a RIE method using fluoride gas, such as $CF_4$ or $CHF_3$, as an etching gas may be performed as the dry etching method.

Figure 1C:
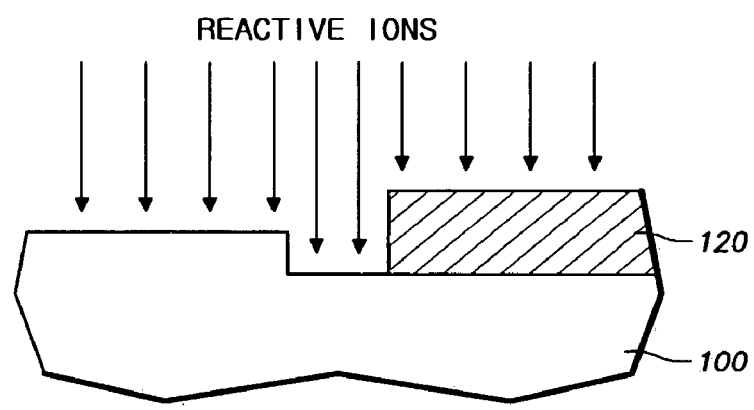

A second exposure process to form a photoresist, for example, second photoresist 120, on the substrate at the other side of the region in which trench pattern 130 will be formed may be performed as shown in FIG. 1C.

In the second exposure process, similar to the first exposure process, a photoresist film coated on substrate 100 having the pattern illustrated in FIG. 1B may be subjected to an exposure process in an exposure apparatus using a predetermined exposure mask (not shown) and may be baked in a baking apparatus. The exposed photoresist film may be removed using a predetermined development solution such that only second photoresist 120 remains, as shown in FIG. 1C.

A second etching process may be performed using a predetermined dry etching method with respect to substrate 100 on which second photoresist 120 may have been formed. This may form the pattern of substrate 100, as shown in FIG. 1D.

Figure 1D:
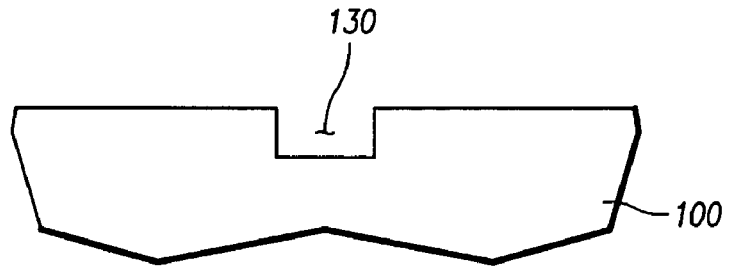

In the second etching process for forming the pattern of substrate 100 shown in FIG. 1D, the trench pattern 130 may be finally formed using the same RIE method as that of the first etching process, according to embodiments.

When a trench shown in FIG. 1D is formed according to embodiments, a realizable minimum pitch of trench 130 may be determined according to the alignment precision of an exposure apparatus. Since a recent exposure apparatus may have alignment precision of 3σ<10 nm (here, σ denotes a standard deviation), the minimum pitch of trench pattern 130 is about 10 nm.

A method of manufacturing a semiconductor device according to embodiments will be described with reference to FIGS. 2A to 2C.

Figure 2A:
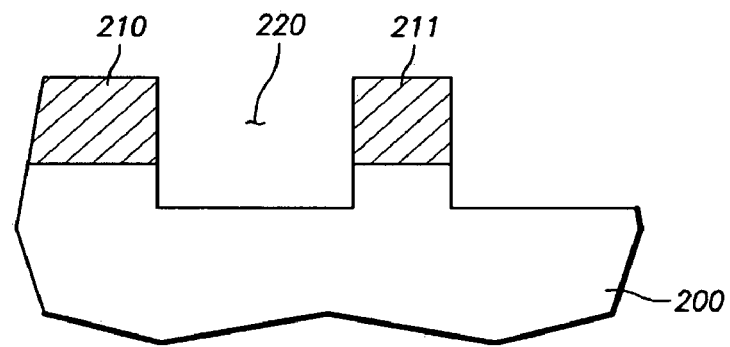
FIGS. 2A to 2C are cross-sectional drawings illustrating a semiconductor device according to embodiments.
Figure 2B:
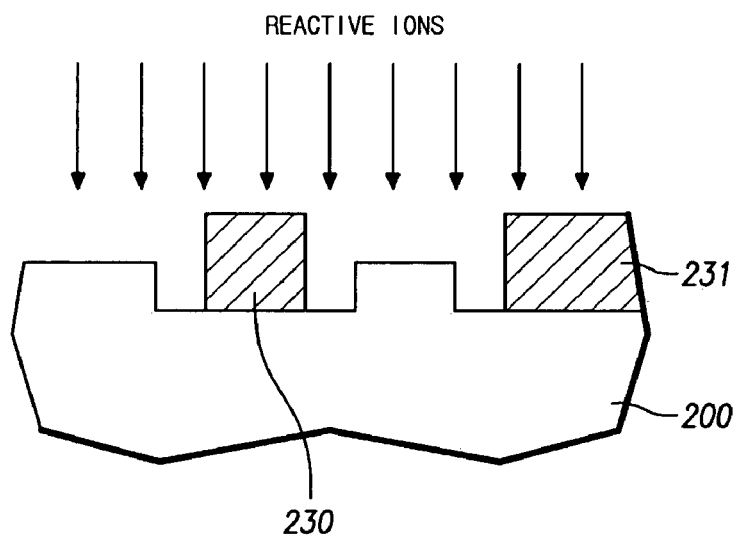
Figure 2C:
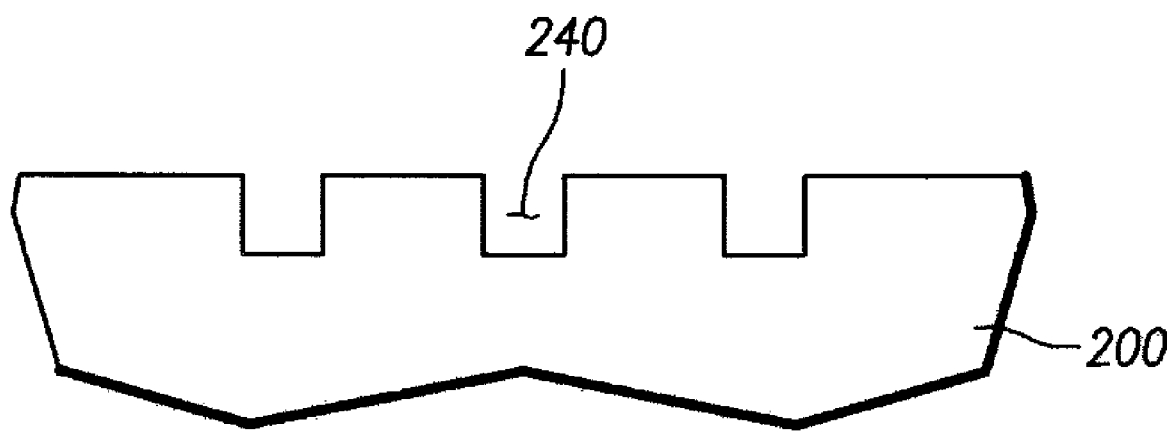

Referring to FIG. 2A, photoresists 210 and 211 may be formed on substrate 200 at a predetermined interval. A dry etching process may be performed such that first trench pattern 220 may be formed. In embodiments, in a process for forming first trench pattern 220, the interval between first photoresists 210 and 211 may be at least twice the pitch of final trench pattern 240 shown in FIG. 2C.

In embodiments, the dry etching method to form first trench pattern 220 may use an RIE method. If substrate 200 is a substrate formed of an oxide film ($SiO_2$), a RIE method using fluoride gas such as $CF_4$ as an etching gas may be performed as the dry etching method. Alternatively, in embodiments, if substrate 200 is a low-k substrate such as black diamond, a RIE method using fluoride gas such as $CF_4$ or $CHF_3$ as an etching gas may be performed as the dry etching method.

After forming first trench pattern 220, second photoresists 230 and 231 may be formed in first trench pattern 220 and may be spaced apart from the side surface of first trench pattern 220 by a predetermined distance. The predetermined distance may correspond to a pitch of final trench pattern 240.

Second photoresists 230 and 231 may be formed in first trench pattern 220 at the interval corresponding to a pitch of final trench pattern 240. A predetermined dry etching process may be performed, and may form final trench pattern 240 shown in FIG. 2C. In embodiments, the predetermined dry etching method for forming final trench pattern 240 may use the same RIE method as the method for forming first trench pattern 220.

When the first trench pattern 220 is formed using the first photoresists 210 and 211 having a large interval therebetween, it may be possible to form a plurality of final trench patterns 240 each having a size smaller than a resolution limit of a related art exposure apparatus. In addition, since trench pattern 220 having an area twice as large as that of a related art exposure method may be formed according to embodiments, embodiments may be advantageous in view of etch resistance which was problematic in the related art exposure method.

According to embodiments, since a depth of a trench which may be etched in each etching step using the RIE method may correspond to half the depth of final trench pattern 240 and trench 240 having a desired depth may be formed by performing all the etching steps, a thicknesses of first photoresists 210 and 211 and second photoresists 230 and 231, which may be required as masks for the RIE of the etching steps, may be also reduced. When a thicknesses of the photoresists is reduced, the resolution of a space pattern such as the trench may increase. In embodiments, as a thickness of the photoresist decreases, the area of the space may decrease. Therefore, it may be possible to form a trench pattern with a resolution higher than that of the related art single exposure/etching process.

According to embodiments, in an exposure apparatus having a wavelength of 248 nm and a NA of 0.68, while a resolution limit pitch is about 365 nm in a single exposure/etching process, a resolution limit pitch may be 180 nm, which may be at least half as small as that of the related art single exposure/etching process, in a double exposure/etching process. Accordingly, a pitch of 180 nm may correspond to a size of a trench pattern of the 90-nm-node device, which can be obtained using a new high-cost exposure apparatus having a wavelength of 193 nm when a single exposure process may be performed.

As described above, according to embodiments, since a method of performing an exposure/etching process twice, to manufacture a semiconductor device may be provided such that a trench pattern can be formed with a minimum pitch of high resolution, it may be possible to improve a pitch limit of a trench pattern.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method of manufacturing a semiconductor device, comprising:

performing a first exposure process to form a first photoresist on a semiconductor substrate at one side of an outside of a trench pattern to be formed;

performing a first dry etch of the semiconductor substrate using the first photoresist as a mask;

performing a second exposure process to form a second photoresist at an opposite side of the outside of the trench pattern, which is a side opposite to the first photoresist; and performing a second dry etch of the semiconductor substrate using the second photoresist as a mask.

2. The method of claim 1, wherein the first and second dry etches are performed by a reactive ion etching (RIE) method.

3. The method of claim 2, wherein the RIE method uses fluoride gas of CF4 as an etching gas.

4. The method of claim 3, wherein CF4 is used as the etching gas and the semiconductor substrate is formed of an oxide film (SiO2).

5. The method of claim 2, wherein the RIE method uses at least one of fluoride gas of CF4 and CHF3 as an etching gas.

6. The method of claim 5, wherein the at least one of fluoride gas of CF4 and CHF3 is used as an etching gas and the semiconductor substrate is a low-k substrate.

7. The method of claim 1, wherein the first and second dry etches form a trench pattern of the semiconductor substrate.

8. A method of manufacturing a semiconductor device, comprising:

performing a first exposure process to form at least one first photoresist on a semiconductor substrate;

performing a first dry etch of the semiconductor substrate using the at least one first photoresist as a mask to form a first trench pattern;

performing a second exposure process to form a second photoresist at a position spaced apart from an inner side surface of the first trench pattern by a predetermined distance; and performing a second dry etch of the semiconductor substrate using the second photoresist as a mask to form a final trench pattern.

9. The method of claim 8, wherein the predetermined distance of the second photoresist corresponds to a pitch of the final trench pattern.

10. The method of claim 8, wherein the first and second dry etches are performed by a reactive ion etching (RIE) method.

11. The method of claim 10, wherein the RIE method uses fluoride gas of CF4 as an etching gas.

12. The method of claim 11, wherein fluoride gas of CF4 is used as the etching gas and the semiconductor substrate is formed of an oxide film (SiO2).

13. The method of claim 10, wherein the RIE method uses at least one of a fluoride gas of CF4 and CHF3 as an etching gas.

14. The method of claim 13, wherein at least one of the fluoride gas of CF4 and CHF3 is used as an etching gas and the semiconductor substrate is a low-dielectric substrate.

15. The method of claim 8, wherein a pitch of the final trench pattern is approximately 10 nm when an exposure apparatus having an alignment precision of $3\sigma<10$ nm is used.

16. The method of claim 8, wherein the at least one first photoresist is formed to be spaced at a predetermined interval.

\* \* \* \* \*